(12) United States Patent
Sakai

(10) Patent No.: US 8,779,631 B2
(45) Date of Patent: Jul. 15, 2014

(54) SWITCHING CIRCUIT AND TEST APPARATUS

(75) Inventor: Hidenori Sakai, Gunma (JP)

(73) Assignee: Advantest Corporation, Tokyo (JP)

( * ) Notice: Subject to any disclaimer, the term of this patent is extended or adjusted under 35 U.S.C. 154(b) by 615 days.

(21) Appl. No.: 13/153,466

(22) Filed: Jun. 5, 2011

(65) Prior Publication Data

US 2012/0007574 A1    Jan. 12, 2012

(30) Foreign Application Priority Data

Jul. 8, 2010    (JP) .................................. 2010-156103

(51) Int. Cl.
*H03K 17/78*    (2006.01)
*G01R 31/28*    (2006.01)
*G01R 15/08*    (2006.01)

(52) U.S. Cl.
CPC ................ *G01R 15/08* (2013.01); *H03K 17/78* (2013.01); *G01R 31/28* (2013.01)
USPC ....................................................... 307/115

(58) Field of Classification Search
CPC ............................... H03K 17/78; G01R 31/28
USPC ....................................................... 307/115
See application file for complete search history.

(56) References Cited

FOREIGN PATENT DOCUMENTS

| JP | H05-48004 U | 6/1993 |
|----|----|----|
| JP | 2008-051641 A | 3/2008 |

OTHER PUBLICATIONS

JP H05-048004, English translation, Jun. 25, 1993.*
Office Action for Japanese Patent Application No. 2010-156103, issued by the Japanese Patent Office on Dec. 24, 2013.

* cited by examiner

*Primary Examiner* — Hal Kaplan

(57) ABSTRACT

Provided is a switching circuit with high withstand voltage. The switching circuit switches whether two terminals are electrically connected to each other, according to a switching signal input thereto. The switching circuit comprises a first switching section that switches whether the two terminals are electrically connected to each other; a first control section that is electrically insulated from the first switching section and controls the first switching section according to an input current; a second switching section that switches whether the input current is input to the first control section; and a second control section that is electrically insulated from the second switching section and controls the second switching section according to the switching signal.

9 Claims, 5 Drawing Sheets

SWITCHING CIRCUIT AND TEST APPARATUS

BACKGROUND

1. Technical Field

The present invention relates to a switching circuit and a test apparatus.

2. Related Art

A switch is used in a test apparatus of a semiconductor circuit, for example. A plurality of resistors for measuring current may be provided between a device under test and the driver of the test apparatus, and the switch may be used to switch which of the current measurement resistors is connected, as shown in Japanese Patent Application Publication No. 2008-51641, for example. In this way, the current measurement range can be switched.

A reed relay can be used as the switch described above. However, a reed relay has portions that are mechanically driven, which results in a short lifespan. Furthermore, a semiconductor switch such as a photocoupler can be used as the switch described above. However, the insulation withstand voltage of a semiconductor switch is more difficult to increase than the insulation withstand voltage of the reed relay. Therefore, using a semiconductor switch in a line transmitting high voltage is difficult.

SUMMARY

In order to solve the above problems, according to a first aspect of the present invention, provided is a switching circuit that switches whether two terminals are electrically connected to each other, according to a switching signal input thereto. The switching circuit comprises a first switching section that switches whether the two terminals are electrically connected to each other; a first control section that is electrically insulated from the first switching section and controls the first switching section according to an input current; a second switching section that switches whether the input current is input to the first control section; and a second control section that is electrically insulated from the second switching section and controls the second switching section according to the switching signal.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
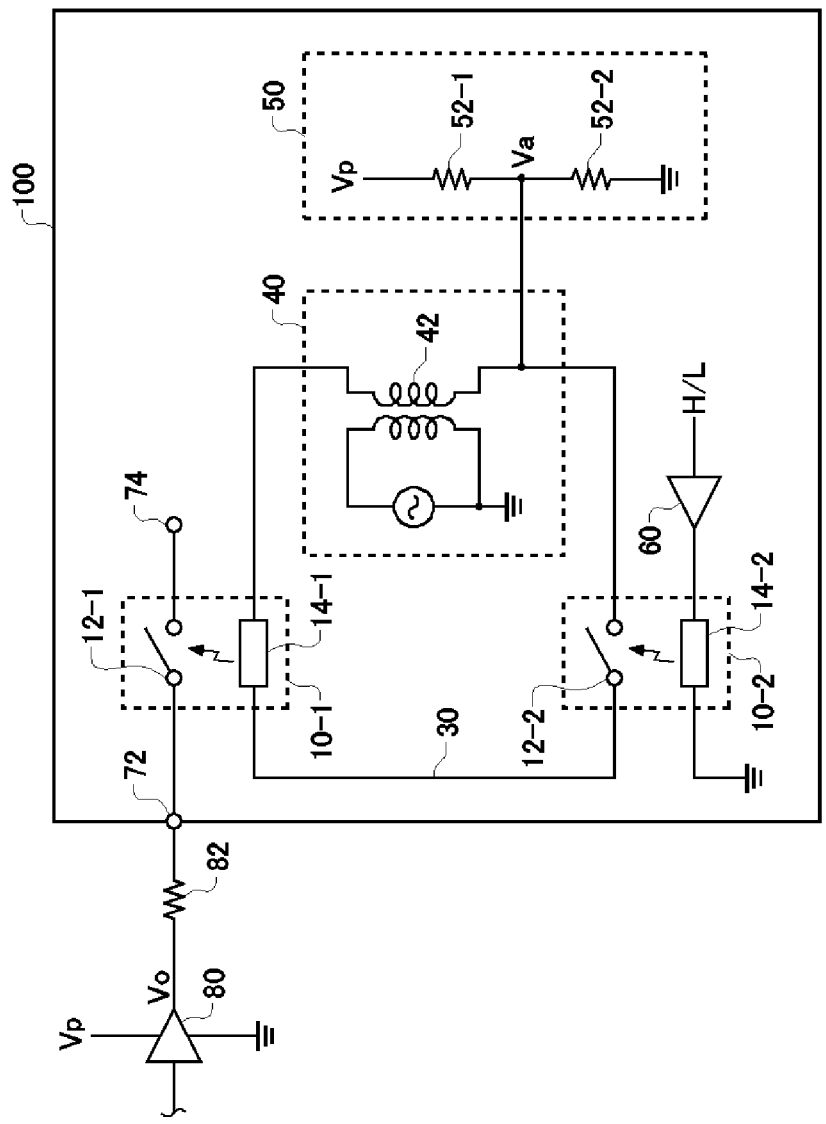
FIG. 1 shows an exemplary configuration of a switching circuit 100 that switches whether two terminals are electrically connected to each other, according to a switching signal input thereto.

FIG. 1 shows an exemplary configuration of a switching circuit 100 that switches whether two terminals are electrically connected to each other, according to a switching signal input thereto. The switching circuit 100 includes a terminal 72, a terminal 74, a first switching section 12-1, a first control section 14-1, a second switching section 12-2, a second control section 14-2, a loop line 30, a power supply 40, a voltage applying section 50, and a current output section 60. The terminals 72 and 74 are connected to a circuit outside the switching circuit 100.

The terminal 72 of the present embodiment is connected to an output end of an external driver circuit 80, via an external resistor 82. The driver circuit 80 receives a power supply voltage Vp, and outputs a voltage less than or equal to the power supply voltage Vp, according to a signal level input thereto. The switching circuit 100 switches whether the voltage output by the driver circuit 80 is transmitted between the terminal 72 and the terminal 74.

The first switching section 12-1 switches whether the two terminals 72 and 74 are electrically connected to each other. The first switching section 12-1 may be an analog switch, such as a semiconductor transistor. The first switching section 12-1 of the present embodiment is electrically connected to the output end of the driver circuit 80 via the resistor 82 and the terminal 72.

The first control section 14-1 is electrically insulated from the first switching section 12-1, and controls the first switching section 12-1 according to current input thereto. The first switching section 12-1 and the first control section 14-1 may respectively be a primary side element and a secondary side element in a photocoupler 10-1.

In other words, the first control section 14-1 may include a light emitting diode that outputs, to the first switching section 12-1, an optical signal corresponding to the input current. The first switching section 12-1 may include a semiconductor transistor that switches whether the two terminals 72 and 74 are electrically connected to each other, according to the optical signal. A signal corresponding to the optical signal is supplied to the gate terminal of the semiconductor transistor.

The first switching section 12-1 and the second control section 14-1 are not limited to being included in the photocoupler. For example, the second control section 14-1 may output, to the first switching section 12-1, an electric wave signal corresponding to the input current. In this case, the first switching section 12-1 switches whether the two terminals 72 and 74 are electrically connected to each other according to the electric wave signal.

The second switching section 12-2 switches whether the input current is input to the first control section 14-1. The second control section 14-2 is electrically insulated from the second switching section 12-2, and controls the second switching section 12-2 according to the switching signal input thereto. The second switching section 12-2 and the second control section 14-2 may have the same characteristics and functions as the first switching section 12-1 and the first control section 14-1. The second switching section 12-2 and the second control section 14-2 of the present embodiment are respectively a primary element and a secondary element of a photocoupler 10-2 having substantially the same characteristics as the photocoupler 10-1.

The first control section 14-1 and the second switching section 12-2 are provided on the same loop line 30. The second switching section 12-2 switches whether the input current is input to the first control section 14-1 by opening and closing the loop of the loop line 30.

The power supply 40 is provided in the loop line 30 and generates the input current. The input current causes the first control section 14-1 to output a signal with a strength capable of turning ON the first switching section 12-1. The power supply 40 may be a floating power supply with a secondary element 42 provided in the loop line 30. The secondary element 42 of the power supply 40 generates the input current corresponding to the current flowing through a primary element thereof.

With this configuration, the input current flows through the first control section 14-1 when the second switching section 12-2 is ON. The first switching section 12-1 is turned ON by this input current, thereby electrically connecting the terminal 72 and the terminal 74.

The current output section 60 supplies the second control section 14-2 with a current corresponding to whether the switching signal received from outside the switching circuit 100 is H or L. This current causes the second control section 14-2 to output a signal with a strength capable of turning ON the second switching section 12-2. The current output section 60 may be a power amplifier, for example.

The second control section 14-2 controls the second switching section 12-2 according to the current output by the current output section 60. The second control section 14-2 may be a light emitting diode in which the anode is connected to the current output section 60 and the cathode is connected to the ground. In other words, the switching signal from outside uses the ground potential as a reference potential.

With the above configuration, two insulating structures, e.g. two photocouplers, can be provided between the first switching section 12-1 that receives voltage from the outside and the second control section 14-2 that receives the switching signal. As a result, the withstand voltage of the switching circuit 100 can be increased.

The voltage applying section 50 generates a voltage Va corresponding to a maximum voltage Vp applied to at least one of the two terminals 72 and 74, and applies this voltage Va to the loop line 30. The voltage applying section 50 generates the voltage Va as an intermediate voltage between the maximum voltage Vp and the reference voltage of the switching signal, which is the ground potential in the present embodiment. Here, "intermediate voltage" means that the voltage is less than the maximum voltage Vp and greater than the reference voltage. For example, the voltage applying section 50 may generate this voltage to be the average of the maximum voltage Vp and the reference voltage.

In the present embodiment, the maximum voltage is the power supply voltage Vp of the driver circuit 80. The voltage applying section 50 may generate the voltage Va to be half of the power supply voltage Vp of the driver circuit 80. The secondary element 42 of the power supply 40 is floating, and therefore the reference voltage of the loop line 30 is the voltage Va.

As a result, the maximum values of the voltage applied between the first switching section 12-1 and the first control section 14-1 and the voltage applied between the second switching section 12-2 and the second control section 14-2 are each Va=Vp/2. Accordingly, the maximum voltage value applied to one insulating structure can be decreased to realize a high withstand voltage for the switching circuit 100.

The voltage applying section 50 may include voltage dividing resistors 52-1 and 52-2. The voltage applying section 50 generates the voltage Va by dividing the voltage Vp applied thereto, according to the resistance ratio between the voltage dividing resistors 52-1 and 52-2.

The voltage applying section 50 may receive the voltage applied to at least one of the two terminals 72 and 74, instead of the power supply voltage Vp of the driver circuit 80. The voltage applying section 50 of the present embodiment receives a voltage Vo output by the driver circuit 80, and generates the voltage Va according to the voltage Vo. The voltage Va is an intermediate voltage between the voltage Vo and the reference potential, and may be half of the voltage Vo, for example.

Figure 2:
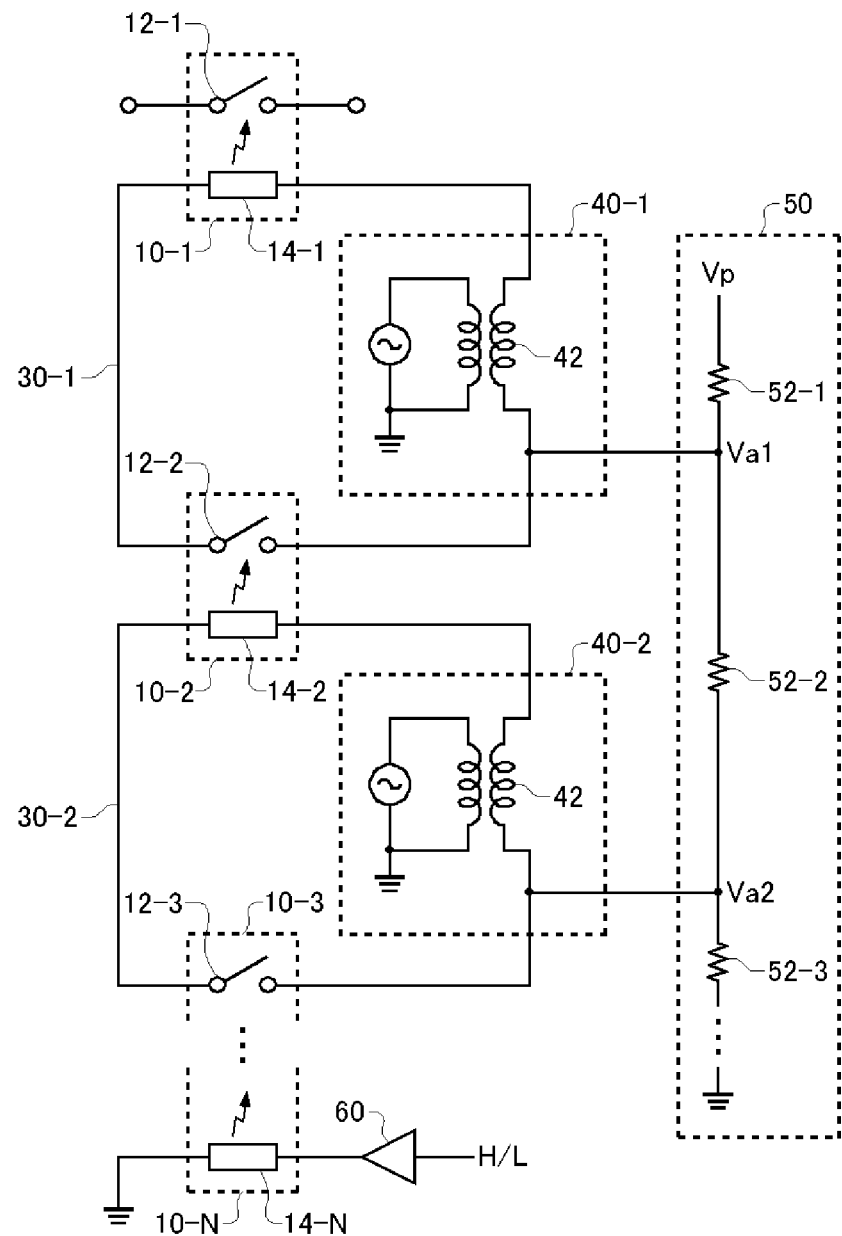
FIG. 2 shows another exemplary configuration of the switching circuit 100.

FIG. 2 shows another exemplary configuration of the switching circuit 100. FIG. 1 shows an example in which the switching circuit 100 includes two stages of photocouplers 10-1 and 10-2, but the switching circuit 100 of the present embodiment includes N stages of photocouplers 10-1 to 10-N. The first switching section 12-1 of the present embodiment corresponds to the first switching section 12-1 shown in FIG. 1, and the N-th control section 14-N corresponds to the second control section 14-2 shown in FIG. 1.

The switching section 12-$k$ ($k$=2, 3, . . . , N) of the photocoupler 10-$k$ is provided in the same loop line 30-($k$−1) as the control section 14-($k$−1) of the photocoupler 10-($k$−1). Each loop line 30 includes a power supply 40. With this configuration, N insulating structures can be provided between the first switching section 12-1 and the N-th control section 14-N. Therefore, the withstand voltage of the switching circuit 100 can be greatly increased.

The voltage applying section 50 generates voltages Va1 to Va(N−1) that are applied respectively to the loop lines 30-1 to 30-(N−1). Each voltage Va($k$) is expressed as shown below.

$$Va(k)=Vx-(Vx \times k/N)$$

Here, Vx is Vp or Vo. With this configuration, the withstand voltage of the switching circuit 100 is further increased.

In the above embodiments, the insulation withstand voltage of each photocoupler 10 is the same, but each photocoupler 10 may instead have a different insulation withstand voltage. The voltage applying section 50 may generate the voltage Va($k$) applied to each loop line 30-$k$ such that the voltage applied between the switching section 12 and the control section 14 of each photocoupler 10 is within a range of the insulation withstand voltage of the photocoupler 10. The voltage applying section 50 may generate the voltage Va($k$) applied to each loop line 30-$k$ such that greater voltages are applied to photocouplers 10 with higher insulation withstand voltages.

Figure 3:
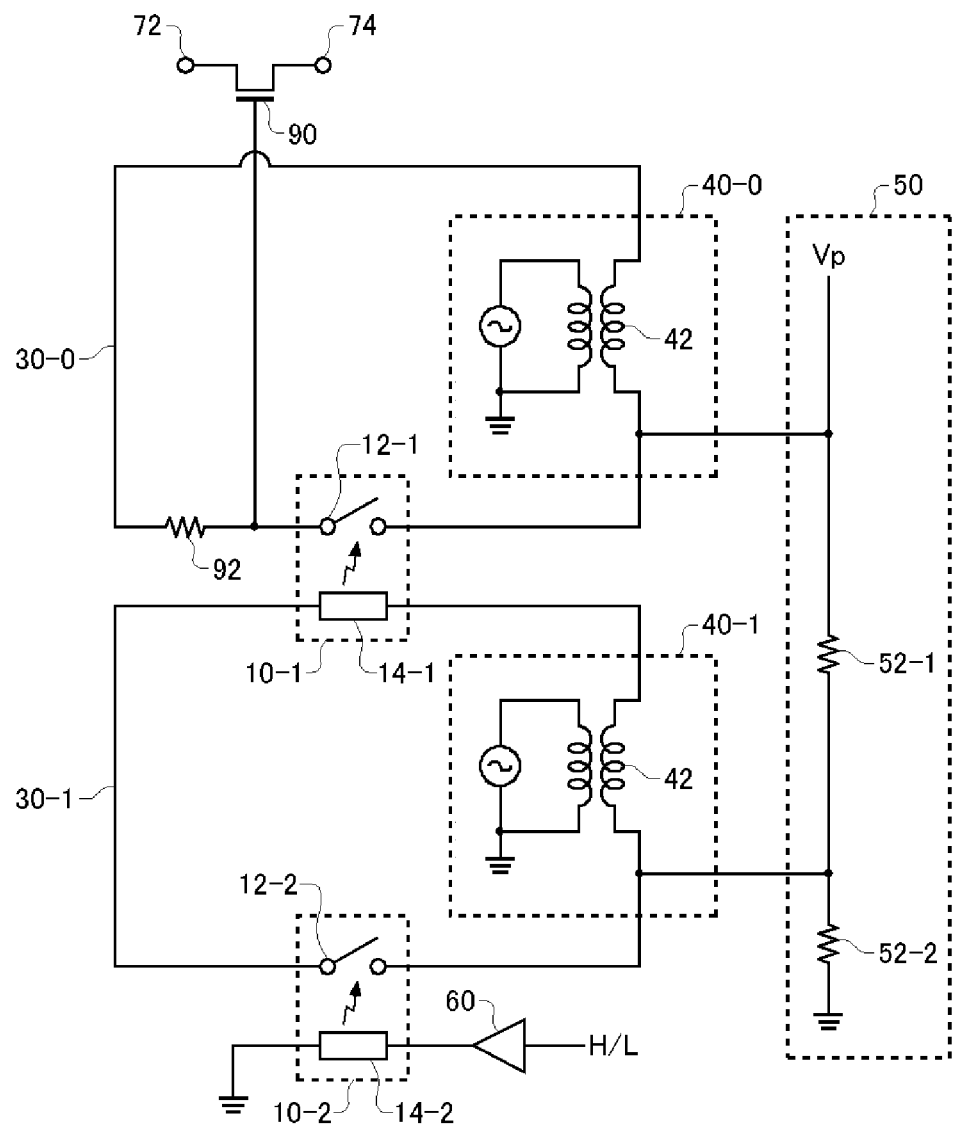
FIG. 3 shows another exemplary configuration of the switching circuit 100.

FIG. 3 shows another exemplary configuration of the switching circuit 100. The switching circuit 100 of the present embodiment further includes a loop line 30-0, a resistor 92, a power supply 40-0, and an analog switch 90, in addition to the configuration of the switching circuit 100 shown in FIG. 1 or 2. The analog switch 90 is provided between the terminals 72 and 74, in place of the first switching section 12-1.

The loop line 30-0 opens and closes the loop by using the first switching section 12-1. The power supply 40-0 generates the current that flows through the loop line 30-0. The resistor 92 is provided in the loop line 30-0. The voltage applying section 50 applies the voltage Vp or Vo to the loop line 30-0.

The analog switch 90 switches whether the terminals 72 and 74 are electrically connected to each other, according to the voltage level at one end of the resistor 92. For example, the analog switch 90 receives, at the gate terminal, the voltage of an end of the resistor 92 connected to the first switching section 12-1. The voltage of the end of the resistor 92 changes depending on whether the current is flowing through the loop line 30-0, and therefore the analog switch 90 can be controlled by the first switching section 12-1. With this configuration, high withstand voltage can be achieved in the switching circuit 100.

Figure 4:
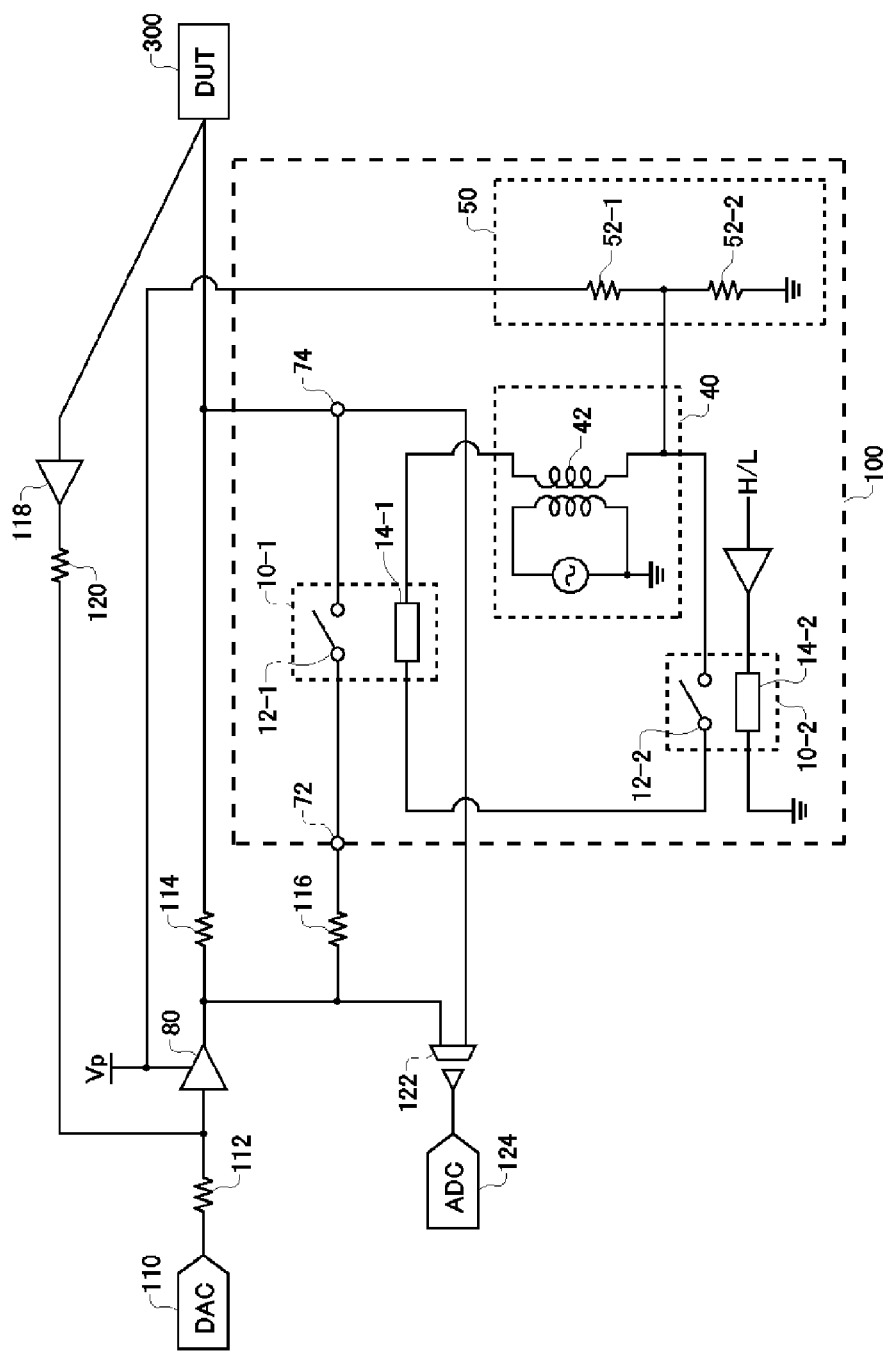
FIG. 4 shows an exemplary configuration of a test apparatus 200, together with a device under test 300.

FIG. 4 shows an exemplary configuration of a test apparatus 200, together with a device under test 300. The test apparatus 200 tests the device under test 300, which may be a semiconductor circuit, for example. The test apparatus 200 uses the switching circuit 100 as a switch provided in a transmission path with relatively high voltage. For example, the test apparatus 200 may include the switching circuit 100 in a signal path connected to a power supply terminal of the device under test 300. The switching circuit 100 is the same as the switching circuit 100 described in relation to any one of FIGS. 1 to 3.

The test apparatus 200 of the present embodiment applies a prescribed voltage to the power supply terminal of the device under test 300, and measures the current flowing though the power supply terminal of the device under test 300. The test apparatus 200 of the present embodiment includes a DAC 110, a driver circuit 80, a plurality of current detection resistors 114 and 116, a buffer 118, a insulating amplifier 122, a ADC 124, resistors 112 and 120, and the switching circuit 100.

The DAC 110 receives digital data indicating a setting value for voltage to be applied to the device under test 300, and outputs an analog voltage corresponding to the digital data. The driver circuit 80 receives the analog voltage output by the DAC 110, via the resistor 112. The driver circuit 80 outputs a voltage corresponding to the received analog voltage. The driver circuit 80 outputs the current that is supplied to the device under test 300. The driver circuit 80 is supplied with the power supply voltage Vp, and outputs a voltage less than or equal to the power supply voltage Vp.

The buffer 118 feeds the voltage applied to the power supply terminal of the device under test 300 back to an input end of the driver circuit 80, via the resistor 120. As a result, the voltage applied to the power supply terminal of the device under test 300 is maintained at the value indicated by the voltage setting value.

The current detection resistors 114 and 116 are provided in parallel between the output end of the driver circuit 80 and the power supply terminal of the device under test 300. The switching circuit 100 whether the current detection resistor 116 is connected to the driver circuit 80 and the device under test 300. In this way, the combined resistance value of the current detection resistors connected between the driver circuit 80 and the device under test 300 can be controlled.

The insulating amplifier 122 detects a voltage drop in the current detection resistors 114 and 116. In this way, the insulating amplifier 122 can measure the sum of the current flowing through the current detection resistors 114 and 116. The ADC 124 converts the voltage level output by the insulating amplifier 122 into a digital value.

As described above, the voltage applying section 50 of the switching circuit 100 applies, to the loop line 30, the voltage Va obtained by dividing the power supply voltage Vp of the driver circuit 80. Instead, the voltage applying section 50 may apply, to the loop line 30, the voltage Va obtained by dividing the voltage Vo output by the driver circuit 80.

With the above configuration, the insulation withstand voltage of the switching circuit 100 can be increased. Therefore, the tests can be performed that involve applying a large power supply voltage to the device under test 300. The use of the switching circuit 100 is not limited to the test apparatus 200. For example, the switching circuit 100 can be applied in various situations where a switch with high withstand voltage is desired.

Figure 5:
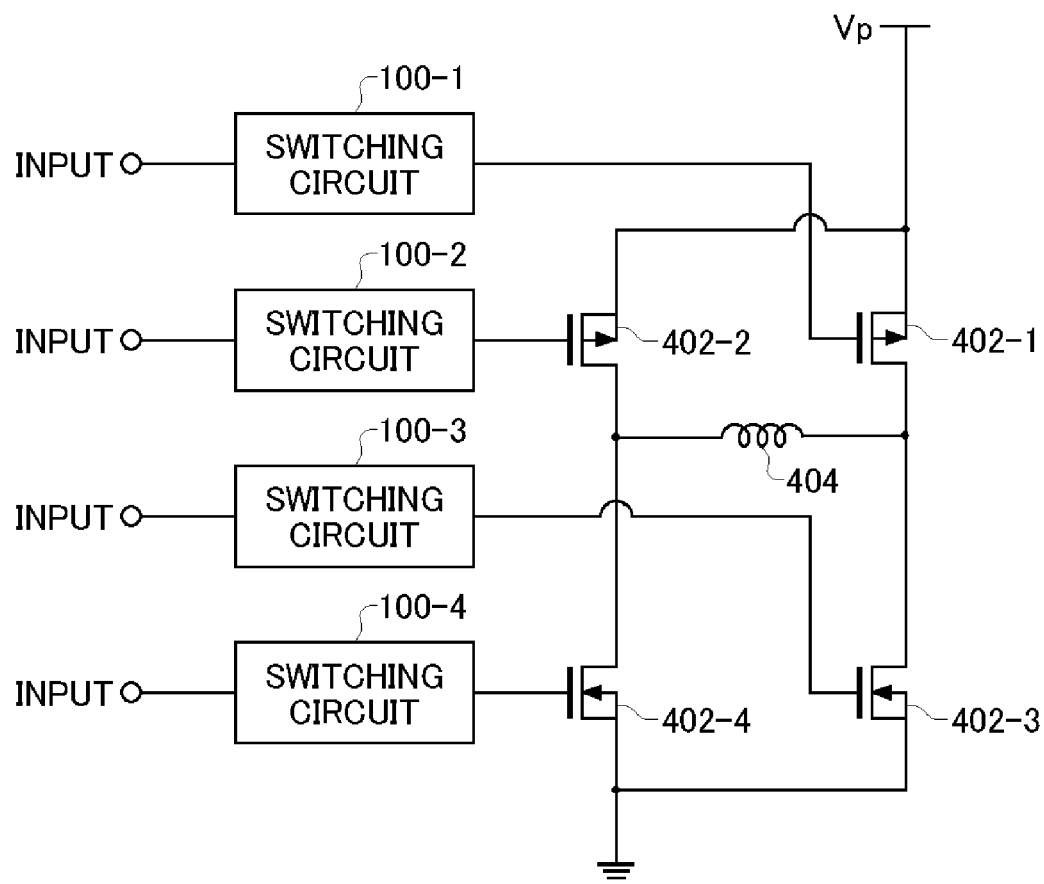
FIG. 5 shows an exemplary configuration of a motor driving circuit 400.

FIG. 5 shows an exemplary configuration of a motor driving circuit 400. The motor driving circuit 400 includes four analog switches 402-1 to 402-4 in a bridge connection, four switching circuits 100 corresponding to the analog switches 402, and a coil 404 that drives the motor.

The switching circuits 100 control the analog switches to alternate between a state in which the analog switches 402-2 and 402-3 are ON and a state in which the analog switches 402-1 and 402-4 are ON. As a result, the direction of the current flowing through the coil 404 can be sequentially inverted, thereby driving the motor.

Each analog switch 402 may be a first switching section 12-1 in the corresponding switching circuit 100. As described in relation to FIG. 3, each analog switch 402 may be an analog switch 90 in the corresponding switching circuit 100.

The voltage applying section 50 in each switching circuit 100 divides the power supply voltage Vp of the bridge circuit formed by the analog switches 402-1 to 402-4, to generate the voltage to be applied to the loop line 30. With this configuration, switching circuits 100 with high withstand voltages can be used in the motor driving circuit 400.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switching circuit that switches whether two terminals are electrically connected to each other, according to a switching signal input thereto, the switching circuit comprising:
    a first switching section that switches whether the two terminals are electrically connected to each other;
    a first control section that is electrically insulated from the first switching section and controls the first switching section according to an input current;
    a second switching section that switches whether the input current is input to the first control section; and
    a second control section that is electrically insulated from the second switching section and controls the second switching section according to the switching signal;
    a loop line that includes the first control section therein; and
    a power supply that is provided in the loop line and generates the input current, wherein
    the second switching section is provided on the loop line to open and close the loop line.

2. The switching circuit according to claim 1, further comprising a voltage applying section that generates a voltage corresponding to a maximum voltage applied to at least one of the two terminals, and that applies the generated voltage to the loop line.

3. The switching circuit according to claim 2, wherein
    the power supply is a floating power supply whose secondary element is provided in the loop line.

4. The switching circuit according to claim 2, wherein the voltage applying section generates an intermediate voltage between a ground potential and the maximum voltage applied to at least one of the two terminals.

5. The switching circuit according to claim 2, wherein
the first switching section is electrically connected to an output end of a driver circuit, and
the voltage applying section generates an intermediate voltage between a ground potential and a power supply voltage of the driver circuit.

6. The switching circuit according to claim 1, further comprising a voltage applying section that generates a voltage corresponding to a voltage applied to at least one of the two terminals, and that applies the generated voltage to the loop line.

7. The switching circuit according to claim 1, wherein
the first control section and the first switching section are respectively a primary element and a secondary element in a photocoupler, and the second control section and the second switching section are respectively a primary element and a secondary element in another photocoupler.

8. The switching circuit according to claim 1, further comprising a current output section that supplies the second control section with current corresponding to the switching signal, wherein
the second control section controls the second switching section according to the current output by the current output section.

9. A test apparatus that tests a device under test, comprising the switching circuit according to claim 1.

\* \* \* \* \*